US010356947B2

(12) United States Patent
Uchino et al.

(10) Patent No.: US 10,356,947 B2
(45) Date of Patent: Jul. 16, 2019

(54) ELECTRONIC APPARATUS

(71) Applicant: LENOVO (SINGAPORE) PTE. LTD., Singapore (SG)

(72) Inventors: Akinori Uchino, Yokohama (JP); Takuroh Kamimura, Yokohama (JP); Hajime Yoshizawa, Yokohama (JP); Shusaku Tomizawa, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 15/634,844

(22) Filed: Jun. 27, 2017

(65) Prior Publication Data

US 2018/0027694 A1 Jan. 25, 2018

(30) Foreign Application Priority Data

Jul. 21, 2016 (JP) .................... 2016-143332

(51) Int. Cl.
*G06F 1/20* (2006.01)
*H05K 7/20* (2006.01)

(52) U.S. Cl.
CPC .......... *H05K 7/2039* (2013.01); *G06F 1/203* (2013.01)

(58) Field of Classification Search
CPC ............ G06F 1/181–182; G06F 1/203; H05K 7/20218–20381; H05K 7/20409–20418; H05K 7/20009–202; H05K 7/2039; H01L 23/367–3677; H01L 23/473; H01L 23/46–467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| 5,731,952 A * | 3/1998 | Ohgami ............... G06F 1/1616 361/679.47 |
| 6,223,815 B1 * | 5/2001 | Shibasaki ............... F28F 13/00 165/185 |
| 8,199,509 B2 * | 6/2012 | Akabori .................. G06F 1/185 165/185 |
| 2002/0080577 A1 * | 6/2002 | Babcock ................. G06F 1/163 361/679.46 |

(Continued)

FOREIGN PATENT DOCUMENTS

| JP | 3122382 U | 6/2006 |
| JP | 2008078564 A | 4/2008 |

*Primary Examiner* — Anthony M Haughton
*Assistant Examiner* — Razmeen Gafur
(74) *Attorney, Agent, or Firm* — Shimokaji IP

(57) ABSTRACT

An electronic apparatus which can achieve both a reduction in thickness of a chassis and an improvement in a heat releasing performance is provided. An electronic apparatus 10 includes a chassis 12 having an electronic component 18 arranged therein, a heat sink 20 which is provided in the chassis 12 and absorbs heat generated from the electronic component 18 when its one surface 20a is arranged to enable conduction of the heat from the electronic component 18, and a heat conducting sheet 22 which is arranged in the chassis 12, closely arranged on the other surface 20c on the side opposite to the one surface 20a of the heat sink, has an outer shape area larger than an outer shape area of the heat sink 20, and extends to the outside of an outer shape of the heat sink 20.

6 Claims, 5 Drawing Sheets

(56) References Cited

U.S. PATENT DOCUMENTS

| | | | |
|---|---|---|---|
| 2004/0174673 A1* | 9/2004 | Lin | G06F 1/184 361/679.54 |
| 2005/0117292 A1* | 6/2005 | DiFonzo | G02F 1/133308 361/679.52 |
| 2006/0120047 A1* | 6/2006 | Inoue | H01L 23/4006 361/699 |
| 2006/0181858 A1* | 8/2006 | Kamemoto | H01L 23/433 361/719 |
| 2006/0187645 A1* | 8/2006 | Numata | H05K 7/2049 361/704 |
| 2006/0198108 A1* | 9/2006 | Refai-Ahmed | H05K 1/0203 361/719 |
| 2006/0268510 A1* | 11/2006 | Jeong | H05K 7/20963 361/689 |
| 2007/0178873 A1* | 8/2007 | Inaba | H03J 1/00 455/340 |
| 2007/0297145 A1* | 12/2007 | Karrer | H01L 23/3735 361/720 |
| 2008/0013286 A1* | 1/2008 | Aoki | H01L 23/3672 361/719 |
| 2008/0165494 A1* | 7/2008 | Artman | H01L 23/367 361/679.54 |
| 2008/0257585 A1* | 10/2008 | Morse | C25D 11/04 174/252 |
| 2009/0135563 A1* | 5/2009 | Sakata | F16M 11/10 361/697 |
| 2009/0244852 A1* | 10/2009 | Okada | H01L 23/433 361/721 |
| 2010/0165574 A1* | 7/2010 | Iwata | H05K 7/20981 361/699 |
| 2010/0251536 A1* | 10/2010 | Lin | G06F 1/20 29/527.4 |
| 2011/0096505 A1* | 4/2011 | Inoue | H01L 23/3675 361/706 |
| 2011/0279970 A1* | 11/2011 | Guan | G06F 1/20 361/679.47 |
| 2012/0020017 A1* | 1/2012 | Kehret | G06F 1/183 361/679.54 |
| 2012/0160456 A1* | 6/2012 | Aoki | G06F 1/20 165/104.26 |
| 2013/0083488 A1* | 4/2013 | Watanabe | H01L 23/10 361/719 |
| 2013/0094152 A1* | 4/2013 | Li | H05K 1/0206 361/720 |
| 2013/0188314 A1* | 7/2013 | Matsunaga | H01L 23/427 361/698 |
| 2013/0199767 A1* | 8/2013 | Karidis | H01L 24/72 165/185 |
| 2013/0242542 A1* | 9/2013 | Uchimi | H05K 7/20136 362/97.1 |
| 2013/0265722 A1* | 10/2013 | Hill | G06F 1/203 361/707 |
| 2013/0286592 A1* | 10/2013 | Tsuduki | H01L 23/055 361/707 |
| 2013/0301222 A1* | 11/2013 | Tsai | H05K 5/0278 361/711 |
| 2013/0308269 A1* | 11/2013 | Rozman | H01L 23/24 361/690 |
| 2014/0009891 A1* | 1/2014 | Chen | H05K 7/2039 361/720 |
| 2014/0085832 A1* | 3/2014 | Matsubara | H05K 7/20445 361/722 |
| 2014/0118954 A1* | 5/2014 | Shi | H05K 7/20545 361/720 |
| 2014/0140011 A1* | 5/2014 | Sunaga | H01L 23/4006 361/715 |
| 2014/0160684 A1* | 6/2014 | Wittenberg | H05K 1/0203 361/719 |
| 2015/0062820 A1* | 3/2015 | Lam | H01L 23/473 361/700 |
| 2015/0208550 A1* | 7/2015 | Rugg | H05K 7/20518 361/713 |
| 2015/0250074 A1* | 9/2015 | Matsumoto | H05K 7/20936 361/696 |
| 2015/0305205 A1* | 10/2015 | Gonzalez | G06F 1/20 361/697 |
| 2016/0050790 A1* | 2/2016 | Arvelo | H01L 23/34 361/699 |
| 2016/0079150 A1* | 3/2016 | Chawla | H01L 23/3675 361/709 |
| 2016/0150673 A1* | 5/2016 | Sunaga | H05K 7/20263 361/715 |
| 2016/0174416 A1* | 6/2016 | Sinha | H01L 21/563 361/719 |
| 2016/0183407 A1* | 6/2016 | Katsumata | H05K 7/20254 361/699 |
| 2016/0282914 A1* | 9/2016 | Saito | H05K 7/20336 |
| 2017/0023306 A1* | 1/2017 | Stavi | F28D 15/0275 |
| 2017/0083060 A1* | 3/2017 | Nicol | H05K 7/20127 |
| 2017/0196122 A1* | 7/2017 | Chen | H05K 7/20509 |

\* cited by examiner

ELECTRONIC APPARATUS

FIELD OF THE INVENTION

The present invention relates to an electronic apparatus in which an electronic component to generate heat is arranged in a chassis.

BACKGROUND OF THE INVENTION

Some of electronic components mounted in an electronic apparatus such as a tablet personal computer (a tablet PC) or a smartphone greatly generate heat. Thus, the heat generated from the electronic components is required to be smoothly diffused in a chassis and released to the outside.

For example, Patent Document 1 discloses a constitution in which a heat sink is arranged on one surface of an electronic component via a graphite sheet having thermal conductivity. In this constitution, the heat from the electronic component is conducted to the heat sink via the graphite sheet, diffused, and then released therefrom.

[Patent Document 1] Japanese Patent Application Laid-Open No. 2008-78564

SUMMARY OF THE INVENTION

Meanwhile, for the above-described heat sink, a vaper chamber, a heat pipe, a metal block having a high thermal conductivity such as copper or aluminum, or the like is generally used.

Such a heat sink has a high heat releasing performance, but a certain level of thickness is necessary. Hence, when an outer shape area of the heat sink is increased to further enhance the heat releasing performance, a reduction in thickness of the chassis of the electronic apparatus is inhibited. In particular, in a portable type electronic apparatus, e.g., the above-described tablet PC or smartphone, or a laptop personal computer (a laptop PC), the reduction in thickness of the chassis is strongly demanded. Therefore, it is often difficult to acquire a space to increase an outer shape area of the heat sink in the chassis of such an electronic apparatus.

The present invention has been achieved in view of the above-described problems in the conventional technology, and it is an object of the present invention to provide an electronic apparatus which can accomplish both a reduction in thickness of a chassis and an improvement in a heat releasing performance.

An electronic apparatus according to the present invention includes a chassis having an electronic component arranged therein; a heat sink which is provided in the chassis and whose one surface is arranged to enable conduction of heat from the electronic component so that the heat generated from the electronic component is absorbed; and a first heat conducting sheet which is provided in the chassis, closely arranged on the other surface on the side opposite to the one surface of the heat sink, has an outer shape area larger than an outer shape area of the heat sink, and extends to the outside of the outer shape of the heat sink.

According to such a constitution, the heat generated from the electronic component is conducted from the heat sink to the heat conducting sheet, diffused, and then released. That is, in the electronic apparatus, its releasing area is increased by using the heat conducting sheet which can be thinned more than the heat sink, both the reduction in thickness of the chassis and the improvement in a heat releasing performance can be achieved.

The electronic apparatus may be a constitution including second heat conducting sheet which is closely arranged on the one surface of the heat sink, has an outer shape area larger than the outer shape area of the heat sink, and extends to the outside of the outer shape of the heat sink. According to this constitution, the heat generated from the electronic component can be diffused and released from both the surfaces of the heat sink, and the higher heat releasing performance can be obtained.

The electronic apparatus may include a constitution in which the heat sink has the outer shape area larger than that of the electronic component, and the second heat conducting sheet has a notch portion which avoids the electronic component arranged on the one surface of the heat sink, and is closely arranged on the one surface of the heat sink exposed around the electronic component. According to this constitution, the thickness due to the second heat conducting sheet does not affect the thickness of the chassis, and hence the heat releasing performance can be improved.

The electronic apparatus may include a constitution in which the first heat conducting sheet and the second heat conducting sheet have a heat releasing section where their portions extending to the outside of the outer shape of the heat sink join together. According to this constitution, the heat from both the surfaces of the heat sink can be efficiently released from the heat releasing section having a certain level of thickness.

The present invention may be a constitution in which the first heat conducting sheet and the second heat conducting sheet are formed by splitting a portion of one heat conducting sheet into two layers in a thickness direction, and the other portion of the one heat conducting sheet forms the heat releasing section. According to this constitution, the first heat conducting sheet and the second heat conducting sheet arranged on both the surfaces of the heat sink can be thinned as much as possible. Further, the heat releasing section becomes an area having a certain level of thickness where the first heat conducting sheet and the second heat conducting sheet join together, and hence the high heat releasing performance can be acquired.

The present invention may be a constitution in which the heat releasing section is formed by bonding the portions of the first heat conducting sheet and the second heat conducting sheet which extend to the outside of the outer shape of the heat sink. According to this constitution, production efficiency is excellent, costs can be reduced, and simultaneously the high heat releasing performance can be acquired.

The electronic apparatus may include a constitution in which a battery device is arranged in the chassis, and the heat releasing section is arranged on a surface of the battery device. That is, on the surface of the battery device, a constitution where a gap that is a space for various kinds of wiring lines is provided is often acquired. Thus, in this electronic apparatus, the heat releasing section for the heat conducting sheet can be arranged in an extra space in this gap, which enhances a use efficiency of the space.

The electronic apparatus may include a constitution in which the electronic component is connected to an electronic substrate arranged on a side of the battery device, a wiring line connected to another electronic component different from the electronic component is connected to the electronic substrate, and the wiring line is arranged to run through a position which is on the surface of the battery device and which does not overlap the heat releasing section.

The electronic apparatus may include a constitution in which a battery device is arranged in the chassis, and a portion of the first heat conducting sheet which extends to the outside of the outer shape of the heat sink is arranged on a surface of the battery device.

According to the present invention, heat generated from the electronic component is conducted from the heat sink to the heat conducting sheet, diffused and then released, and hence both the reduction in thickness of the chassis and the improvement in a heat releasing performance can be achieved.

DETAILED DESCRIPTION OF THE INVENTION

Hereinafter, suitable embodiments of an electronic apparatus according to the present invention will be described in detail with reference to the accompanying drawings.

Figure 1:
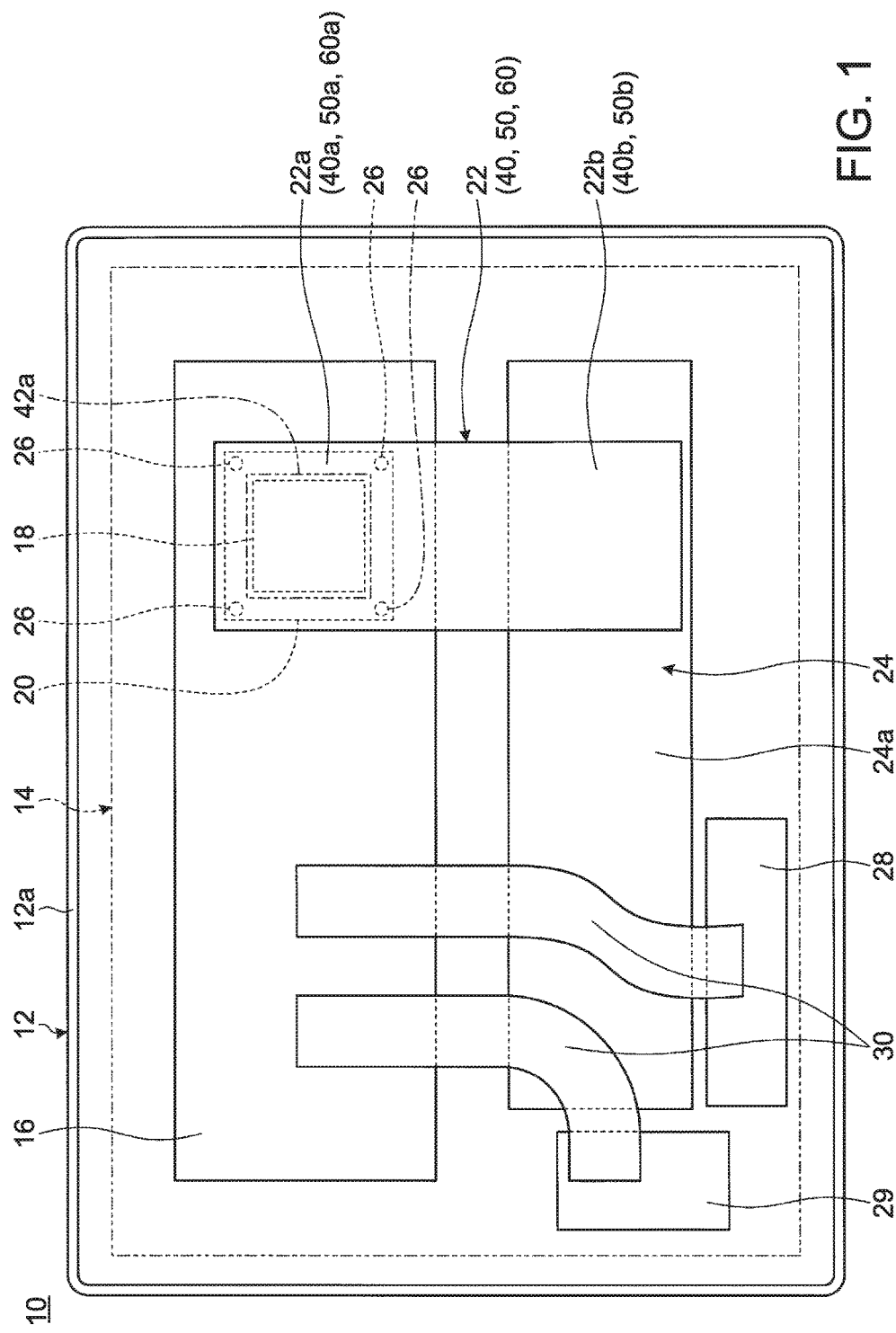
FIG. 1 is a plan view schematically showing an internal structure of an electronic apparatus according to an embodiment of the present invention.
Figure 2:
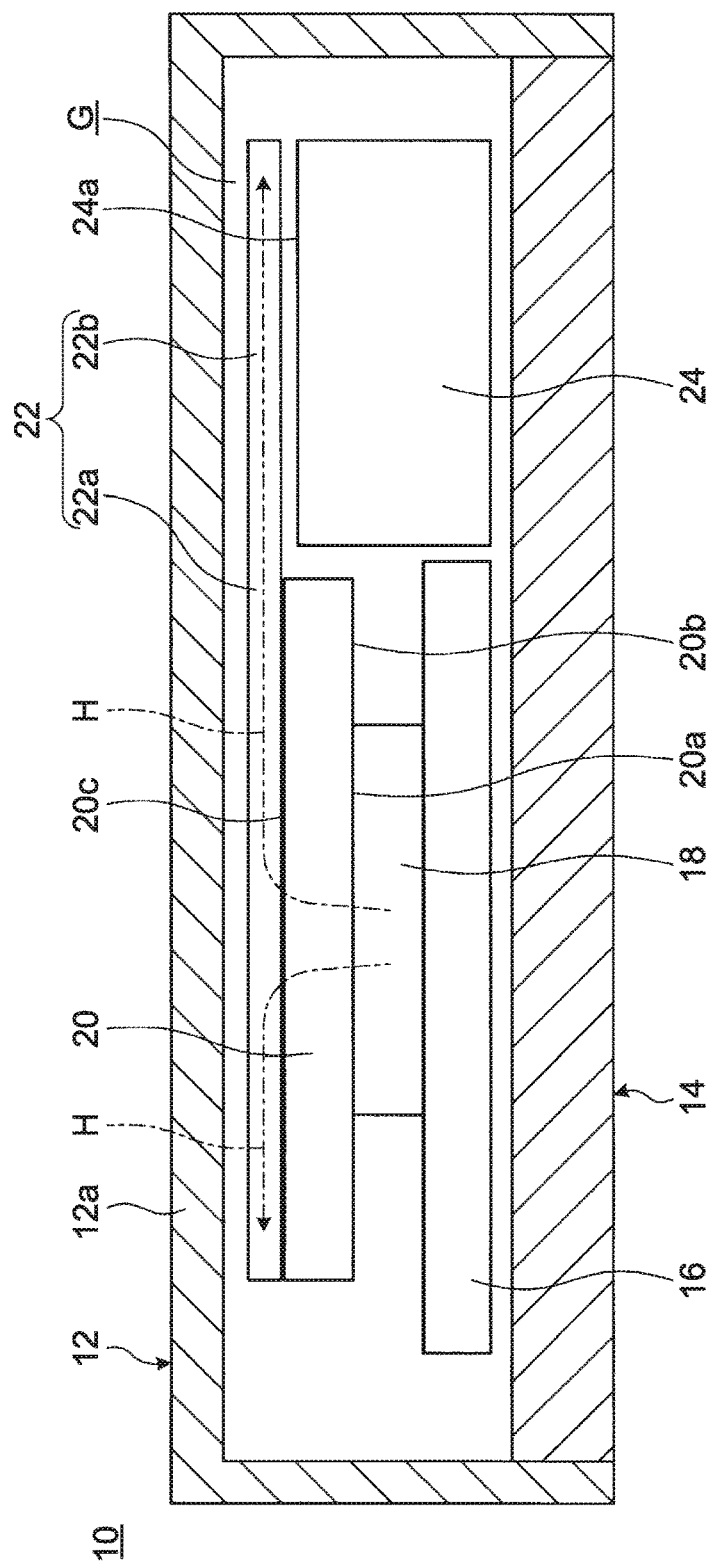
FIG. 2 is a side sectional view schematically showing the internal structure of the electronic apparatus depicted in FIG. 1.

FIG. 1 is a plan view schematically showing an internal structure of an electronic apparatus 10 according to an embodiment of the present invention. FIG. 2 is a side sectional view schematically showing an internal structure of the electronic apparatus 10 depicted in FIG. 1.

In this embodiment, a tablet PC will be exemplified as the electronic apparatus 10. The electronic apparatus 10 may be other than the tablet PC, and it may be, e.g., a laptop PC, a smartphone, a mobile phone, or an electronic notebook.

As shown in FIG. 1 and FIG. 2, the electronic apparatus 10 includes a chassis 12 and a display 14.

The chassis 12 is formed into a flat box shape having a space to accommodate various kinds of electronic components formed therein. The chassis 12 has an exterior cover 12a which covers a back surface to an outer peripheral side surface of the electronic apparatus 10. A front surface of the chassis 12 is closed by the display 14. The exterior cover 12a is a thin plate made of, e.g., a resin or a metal. The display 14 is constituted of a liquid crystal display on which a touch operation is possible.

In the chassis 12, there are arranged various non-illustrated electronic components of an electronic substrate 16, an electronic component 18, a heat sink 20, a heat conducting sheet (a first heat conducting sheet) 22, a battery device 24, a memory and others.

On the electronic substrate 16, there are mounted the electronic component 18 and other electronic components such as various IC chips. The electronic component 18 is a heating element, which generates heat during an operation of the electronic apparatus 10, such as an arithmetic unit like a CPU (Central Processing Unit) or a GPU (Graphics Processing Unit), an image chip or a component for cameras, or the like.

The heat sink 20 is a tabular heat releasing instrument which absorbs heat generated from the electronic component 18 and releases it to the outside. The heat sink 20 is constituted of, e.g., a vaper chamber, a heat pipe, a block member made of copper or aluminum, or the like. One surface 20a of the heat sink 20 which is a surface on the display 14 side is arranged to enable conduction of the heat from the electronic component 18. The one surface 20a of the heat sink 20 and a surface of the electronic component 18 directly abut on or are close to each other, or they abut on each other via a paste member, an adhesive, or the like having thermal conductivity. In this embodiment, the heat sink 20 has an outer shape area larger than that of the electronic component 18 in planar view, and has a board thickness of, e.g., approximately 0.5 mm to several mm. A portion of the one surface 20a of the heat sink 20 which extends to the outside of the outer shape of the electronic component 18 constitutes an exposed surface 20b exposed to a periphery of the electronic component 18. Reference numeral 26 in FIG. 1 denotes a screw to fix the heat sink 20 on the electronic substrate 16.

The heat conducting sheet 22 is a thin heat releasing sheet to further diffuse the heat from the electronic component 18 absorbed by the heat sink 20 and release it to the outside. The heat conducting sheet 22 is made of, e.g., a graphite sheet, an aluminum sheet, or a copper sheet. The heat conducting sheet 22 is closely arranged on the other surface 20c of the heat sink 20 provided on the side opposite to the one surface 20a of the same so that the heat can be conducted. In this embodiment, the heat conducting sheet 22 has an outer shape area larger than that of the heat sink 20 in planar view, and has a thickness of approximately 0.05 mm to 0.1 mm. The heat conducting sheet 22 has a heat absorbing section 22a which is a portion pressed against the other surface 20c of the heat sink 20 and a heat releasing section 22b which is a portion extending outward from the outer shape of the other surface 20c. The heat releasing section 22b is arranged to extend on a surface 24a of the battery device 24.

The battery device 24 is arranged on a side of the electronic substrate 16 in the chassis 12. The battery device 24 is arranged between its surface 24a on a side opposite to its surface on the display 14 side and the exterior cover 12a via a gap G. In the vicinity of the battery device 24, the electronic components 28 and 29 different from the electronic component 18 are arranged. The electronic component 28 is, e.g., a substrate to control the display 14. The electronic component 29 is, e.g., a sub-card for communication. These electronic components 28 and 29 are connected to the electronic substrate 16 via wiring lines 30. The wiring lines 30 are, e.g., flexible printed circuits. The wiring lines 30 are arranged through the gap G above the surface 24a of the battery device 24. In other words, the gap G is acquired as a space to arrange the wiring lines 30 or other wiring lines in the thin chassis 12.

As described above, in the electronic apparatus according to this embodiment, the heat conducting sheet 22 is provided on the other surface 20c of the heat sink 20 which absorbs the heat from the electronic component 18 from the one surface 20a. Further, the heat conducting sheet 22 is formed to have a larger outer shape than the outer shape of the heat sink 20, and the heat releasing section 22b is extended to the outside of the outer shape of the heat sink 20.

Thus, the heat generated from the electronic component 18 is conducted from the heat sink 20 to the heat conducting sheet 22 and then diffused as indicated by arrows H depicted by alternate long and short dash lines in FIG. 2. Consequently, the heat from the electronic component 18 is released from the heat absorbing section 22*a* or the heat releasing section 22*b* of the heat conducting sheet 22 into the chassis 12, and eventually released to the outside of the chassis 12 through, e.g., the exterior cover 12*a*. That is, although the heat sink 20 has the high heat releasing performance, it has a certain level of thickness. Thus, when the outer shape area of the heat sink 20 is extremely increased to improve the heat releasing performance, a reduction in thickness of the chassis 12 is inhibited. On that point, in the electronic apparatus 10, the heat conducting sheet 22 which can be greatly thinned as compared with the heat sink 20 is used, whereby the heat absorbed by the heat sink 20 can be considerably diffused and efficiently released. Consequently, both the reduction in thickness of the chassis 12 and the improvement in a heat releasing performance can be achieved. That is, the heat conducting sheet 22 is formed in a thinner and more flexible state as compared with the heat sink 20. Thus, the heat conducting sheet 22 can be relatively freely arranged on, e.g., the surface 24*a* of the battery device in the chassis 12, and the high heat releasing performance and the reduction in thickness of the chassis 12 can be acquired.

On the surface 24*a* of the battery device 24 in particular, it is often the case that the gap G serving as the above-described space for the wiring lines 30 is provided. Thus, in the electronic apparatus 10, arranging the heat releasing section 22*b* of the heat conducting sheet 22 in the extra space in the gap G which does not overlap the wiring lines 30 enhances the use efficiency of the space.

Figure 3:
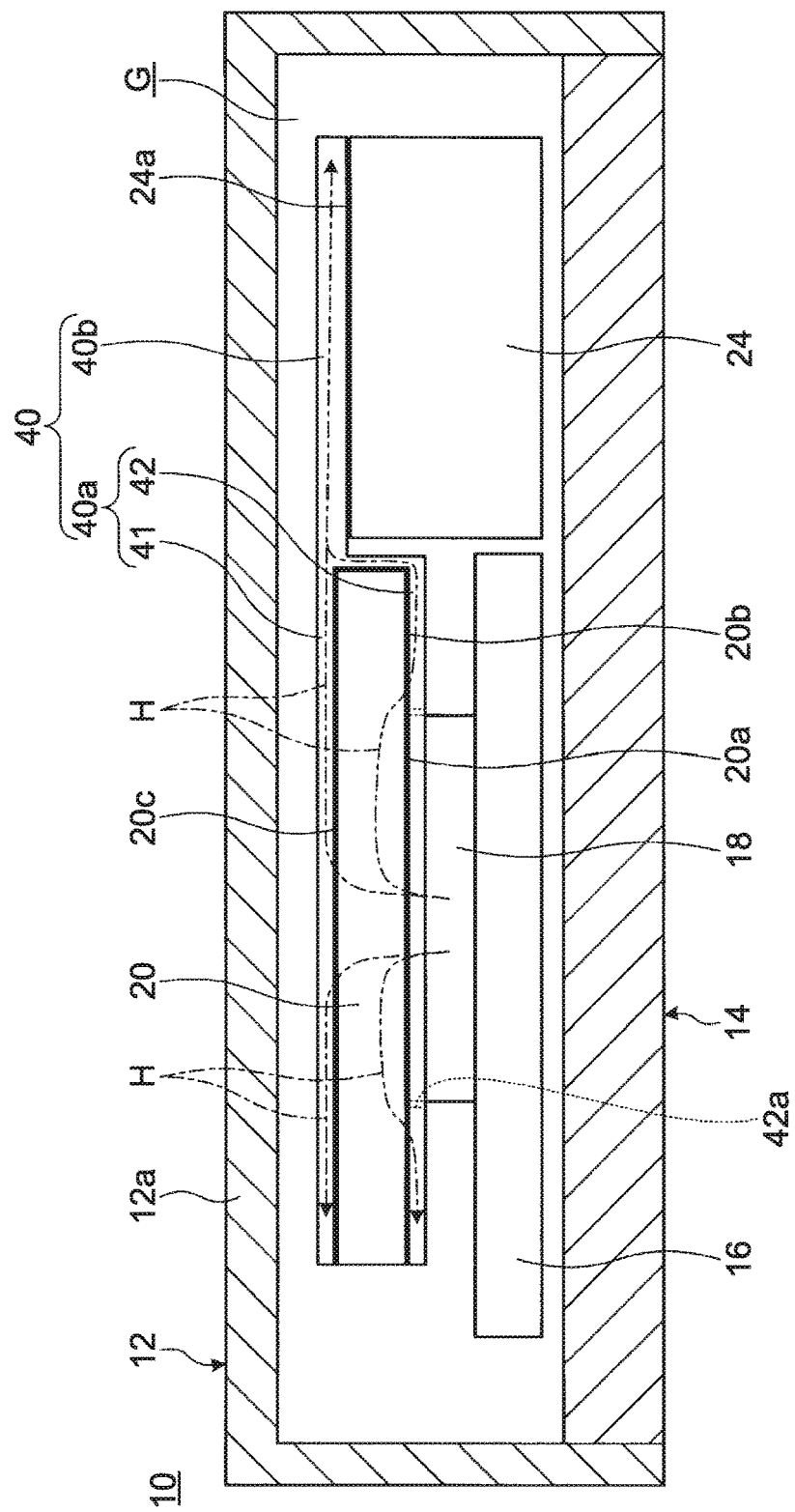
FIG. 3 is a side sectional view schematically showing an internal structure of an electronic apparatus including a heat conducting sheet according to a first modification.

FIG. 3 is a side sectional view schematically showing an internal structure of an electronic apparatus 10 including a heat conducting sheet 40 according to a first modification.

As shown in FIG. 3, a heat conducting sheet 40 is constituted of a first heat conducting sheet 41 and a second heat conducting sheet 42. The first heat conducting sheet 41 and the second heat conducting sheet 42 are made of the same material as that of the heat conducting sheet 22. The first heat conducting sheet 41 and the second heat conducting sheet 42 are thin heat releasing sheets to further diffuse heat from an electronic component 18 absorbed by a heat sink 20 and release the heat to the outside.

The first heat conducting sheet 41 is closely arranged on the other surface 20*c* of the heat sink 20 so that the heat can be conducted. The first heat conducting sheet 41 has a larger outer shape area than an outer shape of the heat sink 20 in planar view.

The second heat conducting sheet 42 is closely arranged on one surface 20*a* of the heat sink 20 so that the heat can be conducted. Specifically, the second heat conducting sheet 42 has a notch portion 42*a* which avoids the electronic component 18 arranged on the one surface 20*a* of the heat sink 20, and is closely arranged on an exposed surface 20*b*. The second heat conducting sheet 42 has an outer shape area larger than the outer shape area of the heat sink 20 in planar view. The notch portion 42*a* is formed of, e.g., a rectangular hole portion which is slightly larger than an outer shape of the electronic component 18 (see the notch portion 42*a* depicted by an alternate long and two dashes line in FIG. 1).

Each of the first heat conducting sheet 41 and the second heat conducting sheet 42 has a thickness which is approximately a half (e.g., 0.025 mm to 0.05 mm) of that of the heat conducting sheet 22. As to the heat conducting sheet 40, each of the first heat conducting sheet 41 and the second heat conducting sheet 42 pressed against the other surface 20*c* and the exposed surface 20*b* of the heat sink 20 functions as a heat absorbing section 40*a*. Furthermore, in the heat conducting sheet 40, portions of the first heat conducting sheet 41 and the second heat conducting sheet 42 which extend to the outside of outer shapes of the other surface 20*c* and the exposed surface 20*b* function as a heat releasing section 40*b*. The heat releasing section 40*b* is arranged to extend on a surface 24*a* of a battery device 24 like the heat releasing section 22*b* of the heat conducting sheet 22. In regard to the heat conducting sheet 40, a portion of one heat conducting sheet is split into two layers along a thickness direction to form the first heat conducting sheet 41 and the second heat conducting sheet 42. In the heat conducting sheet 40, the other portion which serves as an unsplit base side of this one heat conducting sheet forms the heat releasing section 40*b*. The heat releasing section 40*b* has a thickness which is approximately the same (e.g., 0.05 mm to 0.1 mm) as that of the heat conducting sheet 22.

As described above, in this electronic apparatus 10, the heat conducting sheet 40 having the first heat conducting sheet 41 and the second heat conducting sheet 42 may be provided. According to such a constitution, as indicated by arrows H depicted by alternate long and short dash lines in FIG. 3, the heat generated from the electronic component 18 is conducted from both surfaces of the heat sink 20 to the first heat conducting sheet 41 and the second heat conducting sheet 42 and then released. Consequently, the heat from the electronic component 18 is released from the first heat conducting sheet 41 and the second heat conducting sheet 42 constituting the heat absorbing section 40*a* or the heat releasing section 40*b* where these sheets join together into a chassis 12, and eventually released to the outside of the chassis 12 through, e.g., an exterior cover 12*a*. That is, the heat conducting sheet 40 can absorb the heat from both the surfaces of the heat sink and release the same, it has the higher heat releasing performance than that of the heat conducting sheet 22.

Moreover, the heat conducting sheet 40 is thinned by splitting one heat conducting sheet into two layers, i.e., the first heat conducting sheet 41 and the second heat conducting sheet 42 along the thickness direction. Thus, even though the first heat conducting sheet 41 and the second heat conducting sheet 42 are arranged on both the surfaces of the heat sink 20 respectively, a thickness dimension is not increased, and a reduction in thickness of the chassis 12 is not inhibited. On the other hand, since the heat releasing section 40*b* has a thickness which is approximately double the thickness of the first heat conducting sheet 41 or the second heat conducting sheet 42, the higher heat releasing performance can be acquired. Additionally, since the second heat conducting sheet 42 avoids the electronic component 18 by the notch portion 42*a*, this second heat conducting sheet 42 does not affect the reduction in thickness of the chassis 12.

Figure 4:
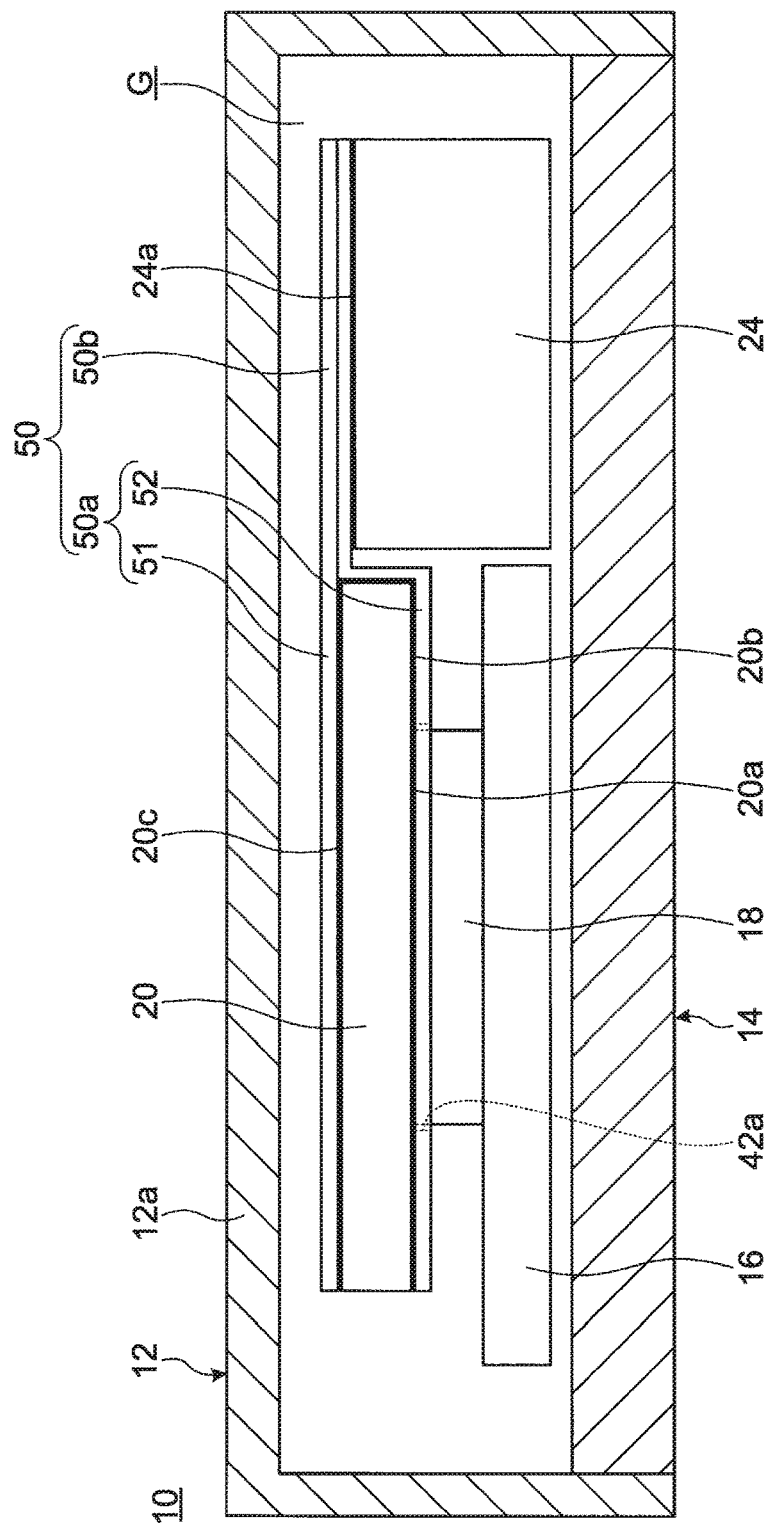
FIG. 4 is a side sectional view schematically showing an internal structure of an electronic apparatus including a heat conducting sheet according to a second modification.

FIG. 4 is a side sectional view schematically showing an internal structure of an electronic apparatus 10 including a heat conducting sheet 50 according to a second modification.

As shown in FIG. 4, the heat conducting sheet 50 is constituted of a first heat conducting sheet 51 and a second heat conducting sheet 52. The first heat conducting sheet 51 and the second heat conducting sheet 52 are made of the same material as that of the above-described heat conducting sheets 22 and 40. The first heat conducting sheet 51 and the second heat conducting sheet 52 are thin heat releasing sheets to further diffuse heat from an electronic component 18 absorbed by a heat sink 20 and release the heat to the outside.

The first heat conducting sheet 51 is closely arranged on the other surface 20c of the heat sink 20 so that the heat can be conducted. The first heat conducting sheet 51 has an outer shape area larger than an outer shape area of the heat sink 20 in planar view.

The second heat conducting sheet 52 is closely arranged on one surface 20a of the heat sink 20 so that the heat can be conducted. Specifically, the second heat conducting sheet 52 is closely arranged on an exposed surface 20b in a state where an electronic component 18 is avoided at a notch portion 42a like the above-described second heat conducting sheet 42. The second heat conducting sheet 52 has an outer shape area larger than the outer shape area of the heat sink 20 in planar view.

Each of the first heat conducting sheet 51 and the second heat conducting sheet 52 has a thickness which is approximately a half (e.g., 0.025 mm to 0.05 mm) of that of the heat conducting sheet 22. As to the heat conducting sheet 50, each of the first heat conducting sheet 51 and the second heat conducting sheet 52 pressed against the other surface 20c and the exposed surface 20b of the heat sink 20 functions as a heat absorbing section 50a. Furthermore, in the heat conducting sheet 50, portions of the first heat conducting sheet 51 and the second heat conducting sheet 52 which extend to the outside of outer shapes of the other surface 20c and the exposed surface 20b function as a heat releasing section 50b. The heat releasing section 50b is arranged to extend on a surface 24a of a battery device 24 like the above-described heat releasing section 22b or 40b. The heat releasing section 50b is formed by bonding the portions of the first heat conducting sheet 51 and the second heat conducting sheet 52 which extend to the outside of the outer shape of heat sink 20. Thus, the heat releasing section 50b has a thickness which is approximately the same (e.g., 0.05 mm to 0.1 mm) as that of the heat conducting sheet 22 or 40.

As described above, in this electronic apparatus 10, the heat conducting sheet 50 having the first heat conducting sheet 51 and the second heat conducting sheet 52 may be provided. According to such a constitution, the heat generated from the electronic component 18 is released from the heat absorbing section 50a or the heat releasing section 50b into a chassis 12, and eventually released to the outside of the chassis 12 through, e.g., an exterior cover 12a. That is, the heat conducting sheet 50 can absorb and release the heat from both the surfaces of the heat sink 20, and has a high heat releasing performance. Further, the heat conducting sheet 50 can be formed by just bonding the portions of the first heat conducting sheet 51 and the second heat conducting sheet 52 as two heat conducting sheets and has excellent manufacturing efficiency, and costs can be reduced. It is to be noted that, for example, a constitution in which the first heat conducting sheet 51 and the second heat conducting sheet 52 are extended on the surface 24a of the battery device 24 and a back surface on the reverse side of the same may be adopted without bonding these sheets.

Figure 5:
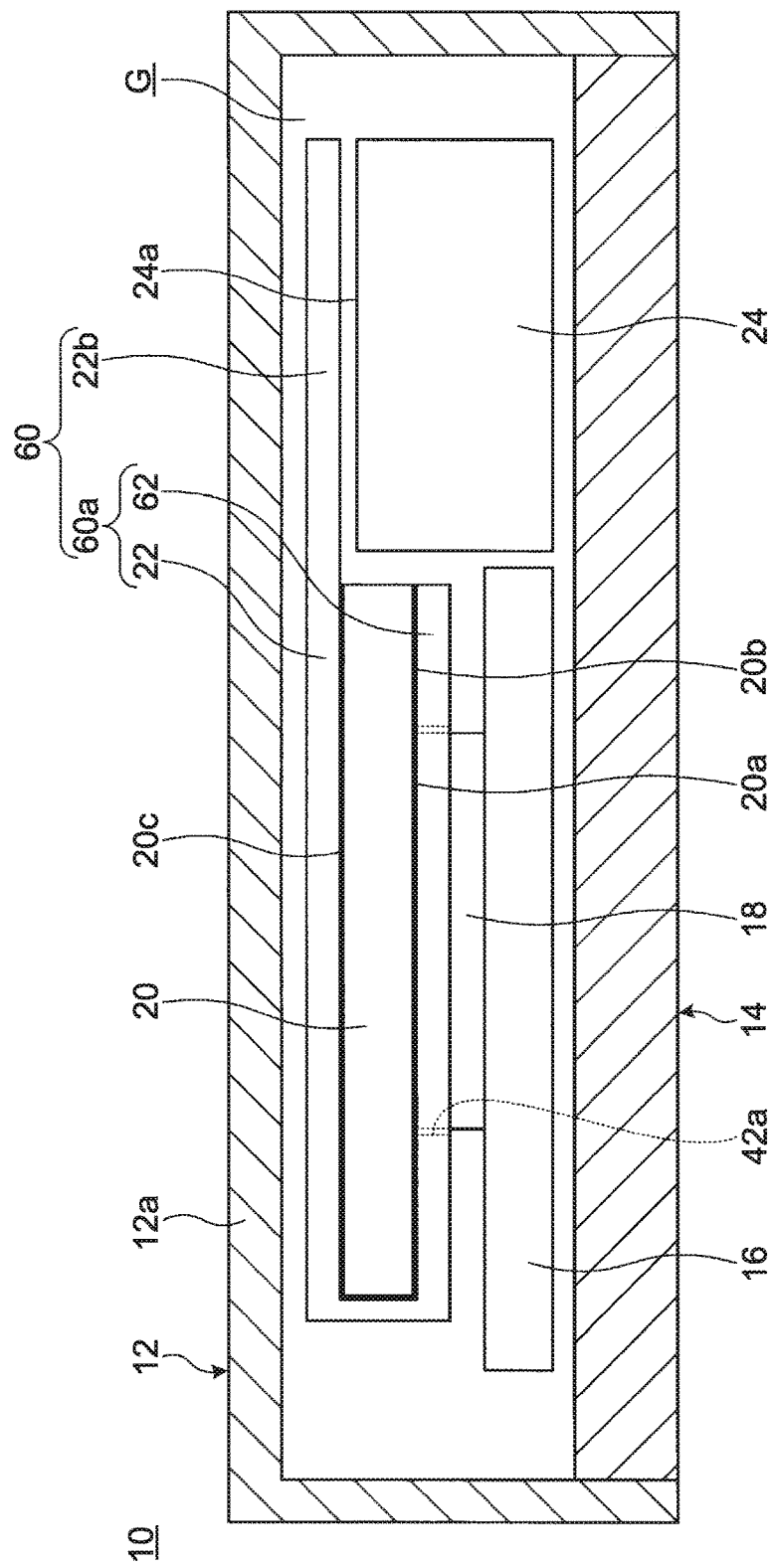
FIG. 5 is a side sectional view schematically showing an internal structure of an electronic apparatus including a heat conducting sheet according to a third modification.

FIG. 5 is a side sectional view schematically showing an internal structure of an electronic apparatus 10 including a heat conducting sheet 60 according to a third modification.

As shown in FIG. 5, an end portion of the heat conducting sheet 60 on the side opposite to the heat releasing section 22b side of the heat conducting sheet shown in FIG. 2 is extended, folded back, and arranged on one surface 20a of a heat sink 20. The heat conducting sheet 60 is constituted of a heat conducting sheet 22 and a second heat conducting sheet 62 which is provided by extending and folding back the end portion of the heat conducting sheet 22.

The second heat conducting sheet 62 is closely arranged on the one surface 20a of the heat sink 20 so that heat can be conducted. Specifically, the second heat conducting sheet 62 is closely arranged on an exposed surface 20b in a state where an electronic component 18 is avoided by a notch portion 42a like the above-described second heat conducting sheet 42 or 52. The second heat conducting sheet 62 has an outer shape area larger than an outer shape area of the heat sink 20 in planar view.

As to the heat conducting sheet 60, each of the heat conducting sheet 22 and the second heat conducting sheet 62, which are appressed against the other surface 20c and the exposed surface 20b of the heat sink 20, functions as a heat absorbing section 60a. Further, in the heat conducting sheet 60, a portion of the heat conducting sheet 22 which extends to the outside of an outer shape of the other surface 20c functions as a heat releasing section 22b.

As described above, the electronic apparatus 10 may include the heat conducting sheet 60 which has the heat conducting sheet 22 and the second heat conducting sheet 62. Consequently, the heat generated from the electronic component 18 is released into a chassis 12 from the heat absorbing section 60a or the heat releasing section 22b, and eventually released to the outside of the chassis 12 through, e.g., an exterior cover 12a. That is, the heat conducting sheet 60 can absorb the heat from both the surfaces of the heat sink and release it, and has the high heat releasing performance. Furthermore, the heat conducting sheet 60 has the second heat conducting sheet 62 formed by folding back the heat conducting sheet 22 which is one heat conducting sheet, has the excellent production efficiency, and can reduce costs.

It is to be noted that the present invention is not restricted to the foregoing embodiment, and can be freely modified without departing from a gist of the present invention as a matter of course.

We claim:

1. An electronic apparatus comprising:
  a chassis having an electronic component arranged therein disposed on an electronic substrate;
  wherein the electronic component has a first electronic component planar surface and a second electronic component planar surface opposite to the first electronic component planar surface;
  wherein the second electronic component planar surface directly contacts the electronic substrate;
  a heat sink in the chassis and over the electronic substrate;
  wherein the heat sink has a first heat sink planar surface, a second heat sink planar surface opposite to the first heat sink planar surface, and a heat sink perimeter surface around the first and second heat sink planar surfaces;
  wherein the first heat sink planar surface is arranged to directly contact all of the first electronic component planar surface to enable conduction of heat from the electronic component so that the heat generated from the electronic component is absorbed by the heat sink;
  a heat conducting sheet consisting of a first heat conducting sheet and a second heat conducting sheet;
  wherein the first heat conducting sheet has a first heat conducting sheet planar surface, a second heat conducting sheet planar surface opposite to the first conducting sheet planar surface, and a first conducting sheet perimeter surface around the first and second heat conducting sheet planar surfaces;
  wherein the second heat conducting sheet has a third heat conducting sheet planar surface, a fourth heat conducting sheet planar surface opposite to the third heat conducting sheet planar surface, and a second conducting sheet perimeter surface around the third and fourth heat conducting sheet planar surfaces;

wherein the first heat sink planar surface, the second heat sink planar surface, the first heat conducting sheet planar surface, the second heat conducting sheet planar surface, the third heat conducting sheet planar surface, and the fourth heat conducting sheet planar surface are parallel to one another;

wherein the first heat conducting sheet is within the chassis and over the electronic substrate, wherein the first heat conducting sheet planar surface is directly on the second heat sink planar surface that is opposite the electronic component, wherein the second heat conducting sheet planar surface has planar area larger than a planar area of the second heat sink planar surface, wherein the planar area of the second heat conducting sheet planar surface extends beyond the heat sink perimeter surface;

wherein the second heat conducting sheet is within the chassis and over the electronic substrate, wherein the third heat conducting sheet planar surface is in direct contact with the first heat sink planar surface, wherein the third heat conducting sheet planar surface is in direct surface-to-surface contact with the heat sink perimeter surface, wherein the third heat conducting sheet planar surface has a planar area larger than the planar area of the first heat sink planar surface, and extends beyond the heat sink perimeter surface;

wherein the second heat conducting sheet has a notch portion configured to avoid the electronic component and prevent the second heat conducting sheet from being between the electronic component and the electronic substrate;

wherein the first heat conducting sheet and the second heat conducting sheet each has a heat releasing section, wherein their heat releasing sections have planar areas that extend beyond the entire perimeter of the heat sink, wherein the heat releasing sections join together;

wherein the first heat conducting sheet and the second heat conducting sheet are formed by splitting, along a direction parallel to and between parallel planar surfaces of, one portion of a single heat conducting sheet into two sheets, and wherein another portion of the heat conducting sheet forms the heat releasing section.

2. The electronic apparatus according to claim 1,
wherein the heat releasing section is formed by bonding the portions of the first heat conducting sheet with the second heat conducting sheet which extend outside of the heat sink.

3. The electronic apparatus according to claim 1,
wherein a battery device is arranged in the chassis, and the heat releasing section is arranged on a surface of the battery device.

4. The electronic apparatus according to claim 3,
wherein the electronic component is connected to the electronic substrate arranged on a side of the battery device,
a wiring line is connected to another electronic component that is different from the electronic component connected to the electronic substrate, and the wiring line is arranged to run through a position which is on a surface of the battery device which does not overlap the heat releasing section.

5. The electronic apparatus according to claim 1,
wherein a battery device is arranged in the chassis, and the portion of the first heat conducting sheet which extends outside of the outer shape of the heat sink is arranged on a surface of the battery device.

6. An electronic apparatus comprising:
a chassis forming a shape having a space therein;
an electronic component;
a heat sink having a first heat sink planar surface, an opposite second heat sink planar surface, and a heat sink perimeter surface around the first and second heat sink planar surfaces, wherein the first planar surface interfaces the electronic component, the first and second planar surfaces being essentially parallel to one another;
a heat conducting sheet having a first heat conducting sheet, a second heat conducting sheet, and a heat releasing section;
wherein the first heat conducting sheet has a first heat conducting sheet planar surface, a second heat conducting sheet planar surface opposite to the first conducting sheet planar surface, and a first conducting sheet perimeter surface around the first and second heat conducting sheet planar surfaces;
wherein the second heat conducting sheet has a third heat conducting sheet planar surface, a fourth heat conducting sheet planar surface opposite to the third heat conducting sheet planar surface, and a second conducting sheet perimeter surface around the third and fourth heat conducting sheet planar surfaces;
wherein the first heat sink planar surface, the second heat sink planar surface, the first heat conducting sheet planar surface, the second heat conducting sheet planar surface, the third heat conducting sheet planar surface, and the fourth heat conducting sheet planar surface are parallel to one another;
wherein the heat conducting sheet is a component physically distinct from the heat sink;
wherein the first heat conducting sheet planar surface is in direct contact with the second heat sink planar surface;
wherein the third heat conducting sheet planar surface is in direct contact with the first heat sink planar surface;
wherein the third heat conducting sheet planar surface is in direct surface-to-surface contact with the heat sink perimeter surface;
wherein first and second heat conducting sheets are joined together in a direct planar-to-planar contact, at an end of the heat sink, to form the heat releasing section;
wherein the heat releasing section extends away from the end of the heat sink;
wherein the heat releasing section is not in direct contact with the electronic component; and
wherein the electronic component, heat sink, and heat conducting sheet are components physically distinct from the chassis, and are disposed within the space.

* * * * *